(12) United States Patent
Entley et al.

(10) Patent No.: US 6,872,323 B1
(45) Date of Patent: Mar. 29, 2005

(54) IN SITU PLASMA PROCESS TO REMOVE FLUORINE RESIDUES FROM THE INTERIOR SURFACES OF A CVD REACTOR

(75) Inventors: William R. Entley, San Jose, CA (US); John G. Langan, Pleasanton, CA (US); Randy Hall, Santa Cruz, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 10/003,908

(22) Filed: Nov. 1, 2001

(51) Int. Cl.[7] .............................................. B08B 9/00
(52) U.S. Cl. ...................... 216/67; 134/1.1; 134/22.1; 438/905
(58) Field of Search ..................... 216/67; 134/1.1, 134/22.1; 438/905

(56) References Cited

U.S. PATENT DOCUMENTS

| | | | |
|---|---|---|---|
| 5,129,958 A | 7/1992 | Nagashima et al. | 134/22.1 |
| 5,207,836 A | 5/1993 | Chang | 134/1 |
| 5,326,723 A | 7/1994 | Petro et al. | 437/192 |
| 5,647,953 A | 7/1997 | Williams et al. | 156/643.1 |
| 5,679,215 A * | 10/1997 | Barnes et al. | 134/1.1 |
| 5,824,375 A | 10/1998 | Gupta | 427/569 |
| 5,935,340 A * | 8/1999 | Xia et al. | 134/1.1 |
| 6,020,035 A | 2/2000 | Gupta et al. | 427/534 |
| 6,068,729 A * | 5/2000 | Shrotriya | 156/345.26 |
| 6,105,589 A * | 8/2000 | Vane | 134/1.1 |
| 6,251,776 B1 * | 6/2001 | Ngo et al. | 438/653 |
| 6,417,080 B1 * | 7/2002 | Yokoshima | 438/514 |
| 6,492,276 B1 * | 12/2002 | Huang | 438/700 |

* cited by examiner

Primary Examiner—Anita Alanko
(74) Attorney, Agent, or Firm—Silicon Valley Patent Group LLP

(57) ABSTRACT

In accordance with an embodiment of the present intention, a fluorine residue removing method includes: supplying an oxygen-containing gas and a hydrogen-containing gas into a CVD chamber; producing a plasma of a mixture of the oxygen-containing gas and the-hydrogen containing gas, so that the plasma reacts with the fluorine residue, exothermically generating water; and evacuating from the CVD chamber a product of the reaction between the plasma and the fluorine residue. For the hydrogen-containing gas, $NH_3$ is often used, and for the oxygen-containing gas, $N_2O$, $O_2$, or air is used. Exemplary mixtures of the oxygen-containing and the hydrogen-containing gases include 70 mol % $N_2O/NH_3$, 50 mol % $N_2O/NH_3$, and 52 mol % $O_2/NH_3$. An inert gas, such as He, Ne, Ar, or Kr, can be optionally supplied into the chamber to stabilize the plasma.

23 Claims, 4 Drawing Sheets

```
┌─────────────────────────────────────┐
│ CHEMICAL VAPOR DEPOSITION (CVD)     │
│ OR PLASMA ENHANCED CVD OF           │
│ SILICON OR TUNGSTEN CONTAINING      │
│ FILMS IN A CVD CHAMBER.             │
└─────────────────────────────────────┘
                  │
                  ▼
┌─────────────────────────────────────┐
│ FLUORINE BASED CLEANING PLASMA      │
│ (IN SITU OR REMOTE) TO REMOVE       │
│ DEPOSITS FROM THE INTERIOR SURFACES │
│ OF THE CVD CHAMBER.                 │
└─────────────────────────────────────┘
                  │
                  ▼
┌─────────────────────────────────────┐
│ IN SITU CLEANING PLASMA OF A        │
│ HYDROGEN CONTAINING GAS AND AN      │
│ OXYGEN CONTAINING GAS TO REMOVE     │
│ FLUORINE RESIDES FROM THE INTERIOR  │
│ SURFACES OF THE CVD CHAMBER.        │
└─────────────────────────────────────┘
```

Figure 1

IN SITU PLASMA PROCESS TO REMOVE FLUORINE RESIDUES FROM THE INTERIOR SURFACES OF A CVD REACTOR

BACKGROUND

In the fabrication of semiconductor integrated circuits on silicon wafers, chemical vapor deposition (CVD) or plasma-enhanced chemical vapor deposition (PECVD) forms dielectric or metallic films on the wafers at relatively low temperatures, such as 400° C. During the deposition process, the films are deposited not only on the wafers but also on the interior surface of CVD or PECVD reactor/chamber, in which the deposition process occurs. The deposition residue on the interior surface of the chamber can be a contamination source that may reduce the yield of subsequent deposition processes in the reactor. Thus, the residue is periodically removed.

The periodic removal of the deposition residue is performed by a chamber cleaning that uses a fluorine-based plasma. The reaction between the plasma and the deposition residue forms volatile products, which are evacuated from the chamber. For example, the fluorine-based chamber cleaning may be carried out after every fifty wafers have been processed. However, the fluorine-based plasma leaves sorbable contaminants and residues on the interior surface of the chamber. Normally, these contaminants and residues are removed only during primary maintenance, where the chamber is vented to the atmosphere and the interior surface of the chamber is physically scrubbed. Primary maintenance is performed far less frequently, e.g., after every 10,000 wafers.

The fluorine residue tenaciously adheres to the interior reactor surfaces of the CVD chamber and is extremely difficult to remove. Further, the fluorine residue can generate significant localized concentrations of HF when the chamber is opened to the atmosphere for the primary maintenance. Accordingly, the fluorine residue needs to be removed between the primary maintenance procedures, and a number of methods for removing fluorine residue have been developed.

The methods include purging the chamber with a hydrogen-containing or reducing gas, dissociating a reducing gas in a remote plasma source and then introducing it into the chamber, generating an $H_2$ plasma in the chamber followed by purging the chamber with a dilute $SiH_4$ mixture, generating a plasma of an inert gas in the chamber, and coating the interior surfaces of the CVD chamber with an oxide layer to trap the residual fluorine.

U.S. Pat. No. 5,647,953, which is incorporated herein by reference in its entirety, discloses a method for removing oxide and fluorine residues in a plasma process chamber. The method energizes fluorine containing gas into plasma and, using the plasma, removes oxide residue from interior surfaces of a CVD chamber. Then the interior surfaces are coated with silicon dioxide in order to trap fluorine impurities from the prior fluorine plasma-cleaning step. The silicon dioxide coating often leaves some of the fluorine impurities without the coating. Finally, a hydrogen-containing gas ($SiH_4$, $Si_2H_6$, $H_2$, and/or $H_2O$) is introduced into the chamber in non-plasma state to remove the fluorine impurities uncoated in the prior coating step. This final step may be done as a purge, or the chamber may be pressurized and then evacuated.

U.S. Pat. No. 5,935,340, which is incorporated herein by reference in its entirety, describes a method for removing residues from the interior surfaces of a CVD chamber. This method dissociates a fluorine containing gas such as $NF_3$ in a remote plasma source and then introduces the dissociated gas into the chamber to clean residues from the interior chamber surfaces. $NH_3$, $H_2$, and/or $SiH_4$, are then introduced into the chamber to remove fluorine residue remaining from the prior step. In the removal of the fluorine residue, in order to cause a heat-induced chemical reaction between fluorine and $NH_3$, $H_2$, and/or $SiH_4$ without in situ plasma excitation, a heater in the chamber maintains a temperature greater than 550° C. and less than about 600° C. $NH_3$, $H_2$, and/or $SiH_4$ may first be dissociated in a remote plasma source before being introduced into the chamber. The clean reactants produced in the heat-induced chemical reaction, such as HF, $SiF_4$, and/or an ammonium fluoride compound, are then evacuated from the chamber.

U.S. Pat. No. 5,824,375, which is incorporated herein by reference in its entirety, describes a method for removing sorbable contaminants from the interior surfaces of a chemical vapor deposition plasma reactor. This method includes cleaning the reactor with a plasma of a cleaning gas having a fluorine source that leaves sorbable contaminants and removing the sorbable contaminants with a plasma of a plasma of an inert gas, such as He. Then, a seasoning film is deposited on the interior reactor surfaces to block or retard remaining contaminants.

U.S. Pat. No. 5,129,958, which is incorporated herein by reference in its entirety, discloses a method of treating the fluorine residues in a CVD chamber left from a prior fluorine plasma cleaning step. This method contacts the fluorine residues with one or more reducing gases, such as $SiH_4$, $NH_3$, H2, $PH_3$, $B_2H_5$, and/or $AsH_3$, to form one or more reaction products. The flow rate of the reducing gases is between 100 and 500 sccm (standard cubic centimeters per minute). While flowing the reducing gases, the CVD chamber is maintained at a temperature of 250 to 500° C. and a pressure of $10^{-3}$ to 100 Torr. The reducing gases react with the fluorine residues to form one or more gaseous and/or solid reaction products. Optionally at least a portion of the reaction products is removed from the CVD chamber.

U.S. Pat. No. 5,207,836, which is incorporated herein by reference in its entirety, describes a procedure for a removal of tungsten or tungsten silicide deposits from the susceptor of a vacuum deposition chamber by fluorine plasma cleaning and a removal of fluorine residues introduced by the plasma cleaning step. In this method, the tungsten-based residues are first removed by flowing a gaseous source of fluorine, such as $SF_6$, $NF_3$, $C_2P_6$, and/or $CF_4$, into the chamber and igniting a plasma. Then, in order to remove the fluorine residue, a gaseous source of hydrogen, such as $H_2$, $B_2H_6$, $PH_3$, 1–2 carbon hydrocarbons, are flowed into the chamber at a rate of approximately 100 to 500 sccm, and a plasma is ignited. While the gaseous source of hydrogen is flowed, the pressure in the chamber is maintained at a pressure from about 0.2 to 1 Torr and the susceptor is maintained at a temperature from about 150 to 525° C.

U.S. Pat. No. 5,326,723, which is incorporated herein by reference in its entirety, discloses a method for cleaning a chemical vapor deposition chamber following tungsten deposition. After the tungsten deposition, an in-situ cleaning with an $NF_3$ based plasma is used to remove tungsten residue from the chamber. This cleaning step produces fluoride-containing by-products. In the next step, an in-situ cleaning with an $H_2$ based plasma is performed in the chamber. This plasma leaves hydrogen fluoride (HF), hydrogen (H), and fluorine (F) species in the chamber. Finally the chamber is purged with a mixture of $SiH_4$, $N_2$, and Ar at a pressure between 0.1 to 5 Torr, wherein the silane is between 1 and 2% of the mixture. The result of the last step is to replace a portion of the fluorine containing compounds on the interior chamber surfaces with $SiF_4$ and $H_2$. These gases ($SiF_4$ and $H_2$) and by-products are subsequently evacuated from the chamber.

U.S. Pat. No. 6,020,035, which is incorporated herein by reference in its entirety, describes a method for reducing the level of fluorine absorbed in films deposited on substrates in a PECVD (Plasma Enhanced CVD) chamber after a fluorine based chamber clean. In this method, a fluorine containing gas is introduced into the chamber to remove the deposition residue from the interior chamber surfaces. This cleaning process leaves a residue including fluorine atoms on the interior chamber surfaces. In the next step, a plasma of a process gas containing silicon and oxygen is used to deposit a silicon oxide film on the interior chamber surfaces. The plasma uses both low frequency (<2 MHz) and high frequency (>2 MHz) RF power sources, with the low frequency power source providing a power density greater than 3.10 $W/cm^2$. The high power level of the low frequency RF signal increases the ion bombardment and favors the formation of stable SiF bonds between silicon and fluorine atoms. This leads to fewer loosely bonded fluorine atoms being incorporated into the layer and fewer fluorine atoms outgassing in subsequent process steps.

Although the prior art described above removes fluorine residue from CVD chambers, the effectiveness of fluorine residue removal process and the speed of the process still need improvement.

SUMMARY

The present invention is directed to a method for removing fluorine residues from a process chamber used in fabricating a semiconductor wafer. After chemical vapor deposition (CVD) or plasma-enhanced chemical vapor deposition (PECVD) for depositing silicon or tungsten containing films on a semiconductor substrate in a CVD chamber, a fluorine-based plasma is often introduced into the CVD chamber to remove the silicon or tungsten containing deposits on the interior surface of the CVD chamber. This fluorine-based plasma cleaning leaves fluorine residues, which can be removed by the method of the present invention.

The method includes: supplying an oxygen-containing gas and a hydrogen-containing gas into a CVD chamber; producing a plasma of a mixture of the oxygen-containing gas and the hydrogen-containing gas, so that the plasma reacts with the fluorine residue, exothermically generating water; and evacuating from the CVD chamber a product of the reaction between the plasma and the fluorine residue. For the hydrogen-containing gas, $NH_3$ is often used, and for the oxygen-containing gas, $N_2O$, $O_2$, or air is used. Exemplary mixtures of the oxygen-containing and the hydrogen-containing gases include 70 mol % $N_2O/NH_3$, 50 mol % $N_2O/NH_3$, and 52 mol % $O_2/NH_3$. An inert gas, such as He, Ne, Ar, or Kr, can be optionally supplied into the chamber to stabilize the plasma.

The fluorine residue removing method according to the present invention can utilize the source gases, such as $N_2O$, $O_2$, and $NH_3$, already plumbed to a CVD chamber for standard deposition processes. That is, no additional gases or modifications of the existing gas manifold are necessary. $N_2O$ is preferred to $O_2$ as the oxygen-containing source gas, because $N_2O$ produces a relatively electronegative discharge that is very stable and diffuse.

BRIEF DESCRIPTION OF THE DRAWINGS

FIG. 1 is a flow chart illustrating a fluorine residue removing method in accordance with the present invention.

DETAILED DESCRIPTION

Figure 2:
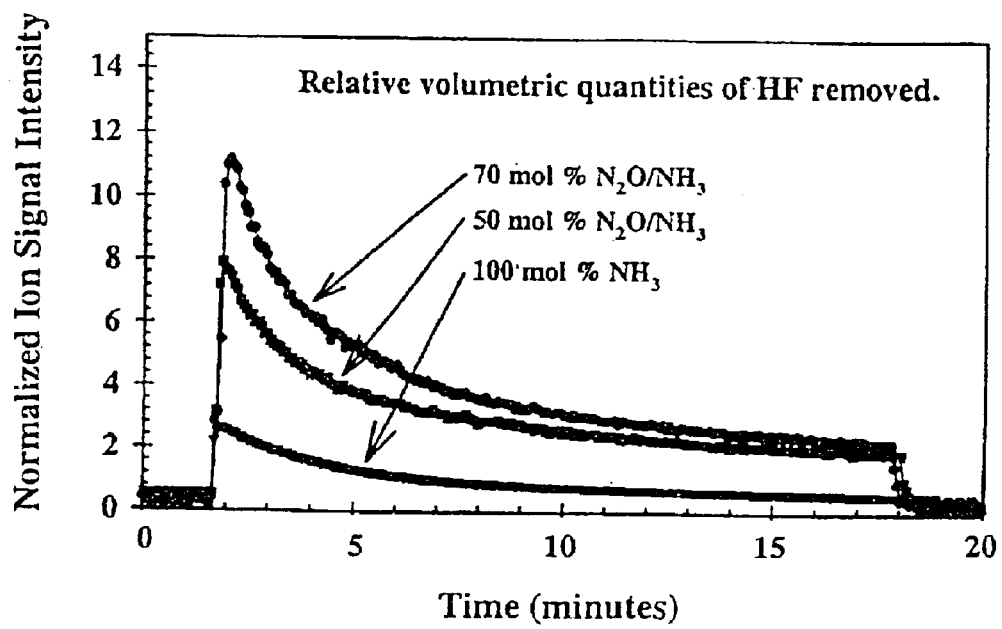
FIG. 2 is a graph illustrating relative volumetric quantities of HF removed in fluorine residue removing methods in accordance with the present invention.

The present invention is directed to a method for removing fluorine residues from the interior surfaces of a CVD chamber prior to primary maintenance. The method eliminates fluorine residues adhering to the interior reactor surfaces of the CVD chamber and prevents the formation of localized concentration of HF when the chamber is opened to atmosphere for primary maintenance.

The method generates a plasma and creates a very aggressive chemical environment that rapidly reacts with residual fluorine. The plasma exothermically generates water in the chamber to purge the fluorine residues. Any CVD chamber that has a supply of a hydrogen-containing gas, such as $NH_3$, and an supply of an oxygen-containing gas, such as $O_2$, $N_2O$, or air, can employ the method according to the present invention to remove the fluorine residues in the CVD chamber. In order to implement the method, the CVD chamber must be equipped with a RF power source. For instance, the method can be immediately implemented in a Concept Two Sequel Express™ reactor, available from Novellus Systems, Inc., of San Jose, Calif.

In a method according to the present invention, a hydrogen-containing gas, such as $NH_3$, and an oxygen-containing gas, such as $O_2$ or $N_2O$, are fed into a CVD chamber and ignited to form a plasma. $N_2O$ is preferred for the oxygen containing gas. An inert gas, such as He, Ne, Ar, or Kr, can be introduced into the chamber to stabilize the plasma discharge. The plasma exothermically forms $H_2O$ in the CVD chamber. The exemplary exothermic $H_2O$ formations are illustrated below as equations (1) to (7). The components of the reactions are at gaseous state during the reactions.

(1) $NH_3 + 1.5N_2O \rightarrow 1.5H_2O + 2N_2$ (2) $2.2NH_3 + 97.8N_2O \rightarrow 3.3H_2O + 98.9N_2 + 47.25O_2$ (3) $72NH_3 + 28N_2O \rightarrow 28H_2O + 64N_2 + 80H_2$ (4) $73.4NH_3 + 26.6N_2O \rightarrow 26.6H_2O + 63.3N_2 + 83.5H_2$ (5) $H_2 + 0.5O_2 \rightarrow H_2O$ (6) $4NH_3 + 3O_2 \rightarrow 2N_2 + 6H_2O$ (7) $4NH_3 + 5O_2 \rightarrow 4NO + 6H_2O$.

The exothermic generation of $H_2O$ in the presence of H, OH, and O radicals and ions creates a very aggressive chemical environment that rapidly reacts with the fluorine residues in the CVD chamber. The heat produced from the exothermic $H_2O$ generation increases the reaction rate between the plasma and the fluorine residue. It is believed that this aggressive chemical environment results not only from the exothermic formation of $H_2O$, but also from the presence of an energetic ion flux moving toward the surface, which results in an ion-enhanced chemical reaction. In addition, the plasma produces extremely reactive radicals and ions, such as OH radicals and ions. These radicals and ions, which are coordinately and electronically unsaturated, can rapidly react with the fluorine residue. Although the exact nature of the fluorine residue is not known, the residue rapidly reacts to form HF and other fluorine-containing products, such as ammonium fluorides, when $NH_3$ is employed as the hydrogen-containing source gas. The HF and other volatile fluorine products are then evacuated from the chamber prior to opening it for primary maintenance.

In the method of the present invention, the combined effect of the plasma-produced reactants, a flux of energetic ions on the interior surface of CVD chamber, and the exothermic formation of $H_2O$ results in the aggressive environment that significantly enhances the removal rate of fluorine residue.

FIG. 1 illustrates a flow chart of a fluorine residue removing method in accordance with the present invention. After chemical vapor deposition (CVD) or plasma-enhanced chemical vapor deposition (PECVD) for depositing silicon or tungsten containing films on a semiconductor substrate in a CVD chamber, a fluorine-based plasma is introduced into the CVD chamber to remove the silicon or tungsten containing deposits on the interior surface of the CVD chamber. The fluorine-based plasma cleaning, which can be performed in-situ or remote, uses a fluorine containing gas such as $CF_4$, $C_2F_6$, $C_3F_8$, $C_4F_8$, $C_4F_8O$, $SF_6$, $NF_3$, or $F_2$ for the plasma source, and optionally adds an oxygen containing gas such as $O_2$ and/or a carrier gas such Ar, Ne, Kr, or He. The plasma cleaning time depends on the thickness of the deposits in the CVD chamber.

After the fluorine-based plasma cleaning, fluorine residues, which may be the combinations of the residual gases ($SiF_4$, HF, $F_2$a $COF_2$, etc.) from the fluorine-based chamber deposition cleaning, remain in the chamber. Thus, as shown in FIG. 1, in-situ fluorine residue cleaning (or removing) is performed to remove the fluorine residues. In this embodiment of the invention, a hydrogen-containing gas, $NH_3$, and an oxygen-containing gas, $N_2O$, are supplied into the CVD chamber so as to form 70 mol % $N_2O/NH_3$ gas mixture, and the mixture is ignited to form an in-situ 13.56 MHz plasma. Exemplary process conditions of the fluorine residue cleaning are described a below with reference to FIGS. 2 to 7.

Then, volatile fluorine products, primarily HF, that result from the reaction between the cleaning plasma and the fluorine residues are evacuated from the chamber. The $H_2O$ generated from the exothermic reactions discussed above is also evacuated with the volatile fluorine products from the chamber.

Figure 3:
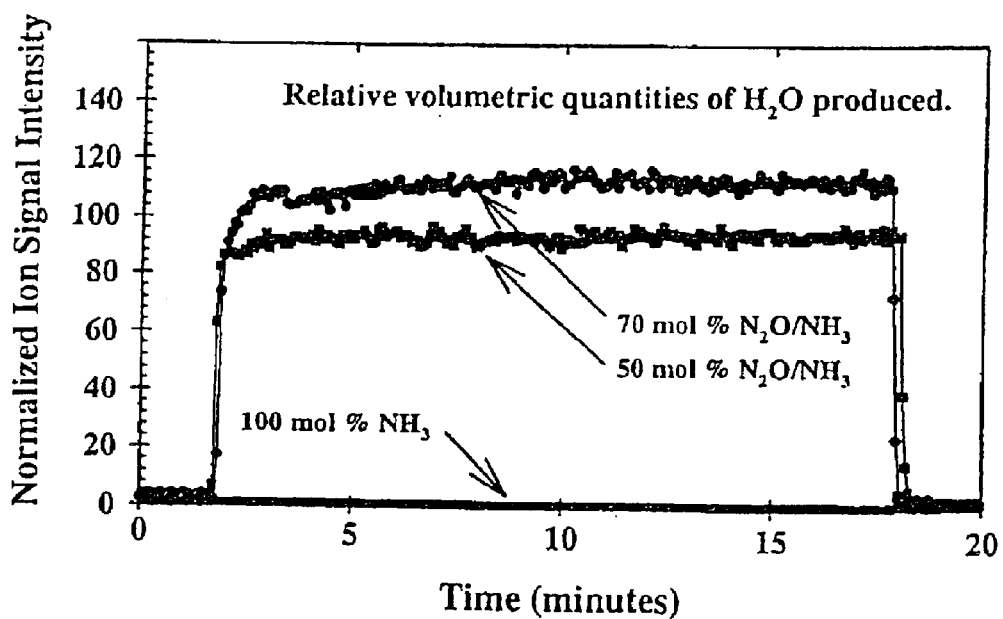
FIG. 3 is a graph illustrating relative volumetric quantities of $H_2O$ produced in the fluorine residue removing methods of FIG. 2.
Figure 4:
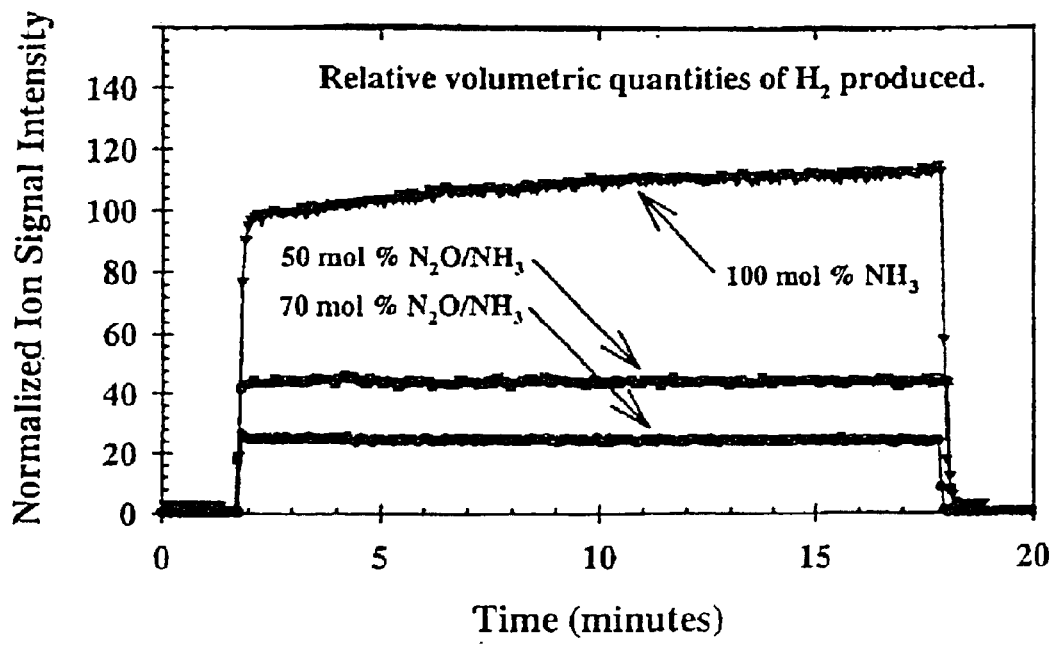
FIG. 4 is a graph illustrating relative volumetric quantities of $H_2$ produced in the fluorine residue removing methods of FIG. 2.

Referring to FIGS. 2 to 4, the effectiveness of a fluorine residue cleaning method, which uses an $N_2O/NH_3$ mixture to produce an $N_2O/NH_3$ plasma, is explained. Experiments, which used 70 mol % $N_2O/NH_3$, 50 mol % $N_2O/NH_3$, and 100 mol % $NH_3$, respectively, to produce a fluorine residue cleaning plasma, were performed in a Concept Two Sequel Express™ chamber, available from Novellus Systems, Inc., of San Jose, Calif. In the experiments, a CVD and a subsequent in-situ fluorine-based plasma cleaning using an $NF_3$/He mixture were commonly performed before the fluorine residue cleanings. The flow rate of $NH_3$ was 1,500 sccm (standard cubic centimeter per minute), and the flow rate of $N_2O$ was varied from 0 to 3,500 sccm. He gas was also introduced at a flow rate of 100 sccm into the chamber as an internal standard for the analysis of the Quadrupole Mass Spectrometer (QMS) data. A high frequency (13.56 MHz) RF power of 3,000 W was applied to the chamber to produce the plasmas, and the pressure of the chamber was 2 Torr. The emissions during the fluorine residue cleanings were characterized with a Quadrupole Mass Spectrometer (QMS) mounted directly to the chamber.

FIG. 2 illustrates relative volumetric quantities of HF removed in the fluorine residue cleanings which used 70 mol % $N_2O/NH_3$, 50 mol % $N_2O/NH_3$, and 100 mol % $NH_3$ plasmas, respectively. The plasmas of $N_2O/NH_3$ mixtures resulted in more effective HF removal than the 100 mol % $NH_3$ plasma. For example, the volumetric HF emission by the 70 mol % $N_2O/NH_3$ plasma was the largest and approximately 316% greater than the volumetric HF emission of the 100 mol % $NH_3$ plasma. In addition, the plasma of 70 mol % $N_2O/NH_3$ was more effective in removing HF than the plasma of 50 mol % $N_2O/NH_3$.

FIGS. 3 and 4 respectively illustrate the relative quantities of $H_2O$ and $H_2$ produced during the experiments of FIG. 1, that is, during the discharges of the 70 mol %, $N_2O/NH_3$, 50 mol % $N_2O/NH_3$, and 100 mol % $NH_3$ plasmas. The $N_2O/NH_3$ plasmas exothermically produced appreciable quantities of $H_2O$, while the $NH_3$ plasma produced almost no $H_2O$. The plasma of 70 mol % $N_2O/NH_3$ produced more Hat than the plasma of 50 mol % $N_2O/NH_3$ did. In contrast, the 100 mol % $NH_3$ plasma generated more $H_2$ molecules than the $N_2O/NH_3$ plasmas did. The plasma of 50 mol % $N_2O/NH_3$ produced more $H_2$ than the plasma of 70 mol % $N_2O/NH_3$ did. Accordingly, FIGS. 3 and 4 show that the effectiveness of the fluorine residue cleaning process is related to the quantity of $H_2O$, not $H_2$, produced during the process.

Figure 5:
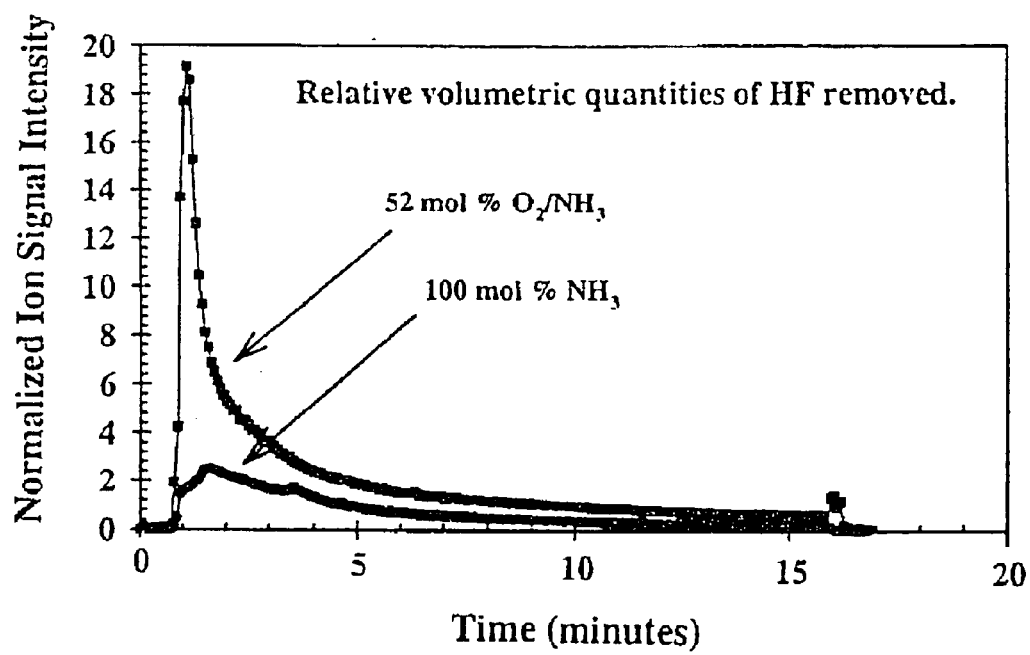
FIG. 5 is a graph illustrating relative volumetric quantities of HF removed in another fluorine residue removing method in accordance with the present invention.
Figure 6:
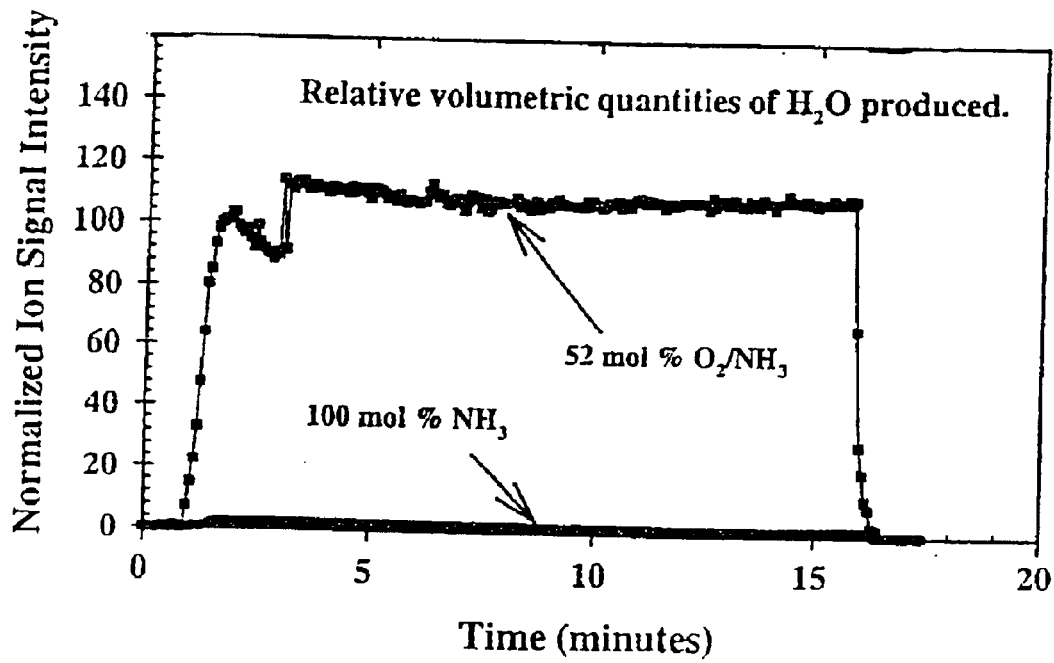
FIG. 6 is a graph illustrating relative volumetric quantities of $H_2O$ produced in the fluorine residue removing method of FIG. 5.
Figure 7:
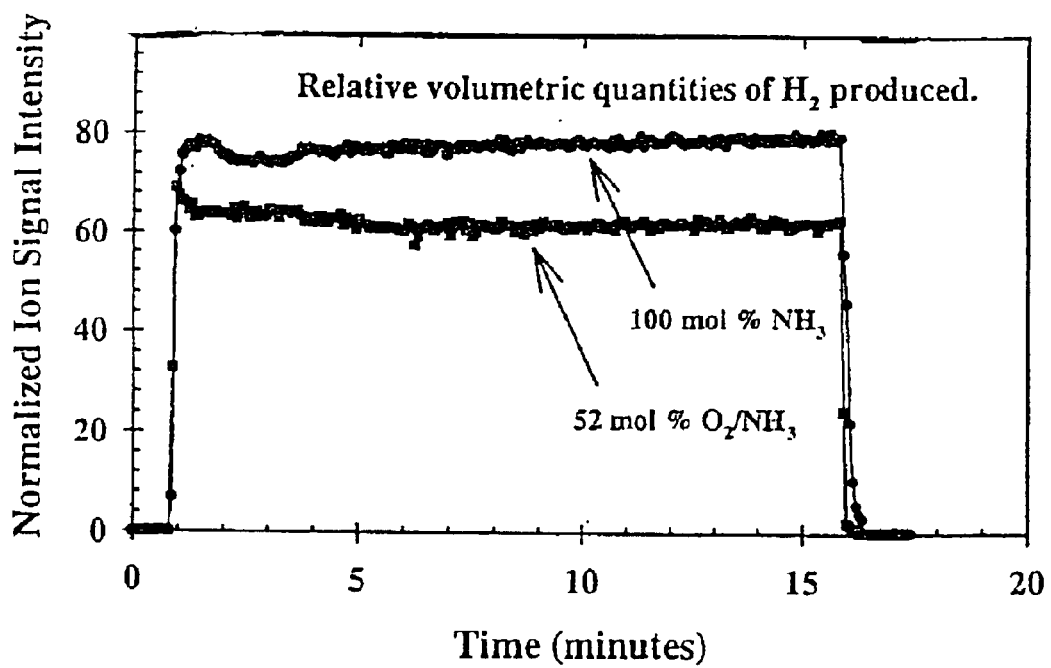
FIG. 7 is a graph illustrating relative volumetric quantities of $H_2$ produced in the fluorine residue removing method of FIG. 5.

Referring to FIGS. 5 to 7, the effectiveness of a fluorine residue cleaning method which uses $O_2/NH_3$ mixture to produce $O_2/NH_3$ plasma is explained. Experiments, which used 52 mol % $O_2/NH_3$ and 100 mol %; $NH_3$, respectively, to produce a fluorine residue cleaning plasma, were performed in a Novellus Systems 200 mm Sequel Express chamber. As in the experiments of FIGS. 2 to 4, a CVD and a subsequent in-situ fluorine-based plasma cleaning using an $NF_3$/He mixture were commonly performed before the fluorine residue cleanings using a 52 mol % $O_2/NH_3$ plasma and a 100 mol % $NH_3$ plasma. The flow of $NH_3$ was 2,000 sccm, and the flow rate of $O_2$ was varied from 0 to 2,170 sccm. He gas was also introduced at a flow rate of 100 sccm into the chamber as an internal standard for the analysis of the QMS data. A high frequency (13.56 MHz) RF power of 2,000 W was applied to the chamber to produce the plasmas, and the pressure of the chamber was 3 Torr.

FIG. 5 illustrates the relative volumetric quantities of HF removed in the fluorine residue cleanings which used the 52 mol % $O_2/NH_3$ plasma and the 100 mol % $NH_3$ plasma, respectively. The 52 mol % $O_2/NH_3$ plasma resulted in more effective HF removal than the 100 mol % $NH_3$ plasma. The volumetric HF emission by the 52 mol % $O_2/NH_3$ plasma was approximately 295% greater than the volumetric HF emission of the 100 mol % $NH_3$ plasma.

FIGS. 6 and 7, respectively, illustrate the relative quantities of $H_2O$ and $H_2$ produced during the experiments of FIG. 5, that is, during the discharges of the 52 mol % $O_2/NH_3$ and the 100 mol % $NH_3$ plasmas. The $O_2/NH_3$ plasma exothermically produced appreciable quantities of $H_2O$, while the $NH_3$ plasma produced almost no $H_2O$. In contrast, the 100 mol % $NH_3$ plasma generated more $H_2$ molecules than the $O2/NH_3$ plasmas did. Accordingly, FIGS. 6 and 7 show the same relationship between the effectiveness of the fluorine residue cleaning process and the quantity of $H_2O$ produced during the process as the relationship shown by FIGS. 3 and 4.

The fluorine residue removing method according to the present invention can utilize the source gases, such as $N_2O$, $O_2$, and $NH_3$, already plumbed to a CVD chamber for standard deposition process. That is, no additional gases or modifications of the existing gas manifold are necessary. $N_2O$ is preferred as the oxygen-containing source gas, because $N_2O$ produces a relatively electronegative discharge that is very stable and diffuse. For CVD chambers that do not have an oxygen-containing source gas available, mixtures of air and a hydrogen-containing source gas may be employed to produce plasma.

Finally, when the fluorine residue removing method according to the present invention uses $N_2O$ as the oxygen-containing gas and $NH_3$ as the nitrogen-containing gas, care must be taken to insure that the gas mixture is diluted since $N_2O$ and $NH_3$ are incompatible gases. Adequate $N_2$ purge may accomplish the dilution before the gas mixture enters the compressive stage of the mechanical backing pump. Similar consideration must be given to other gas mixtures employed.

For instance, the flammability triangle of $N_2/N_2O/NH_3$ mixtures shows that the LEL (Low Explosive Limit) depends upon the extent of nitrogen dilution. To stay at or below the LEL, 70% $N_2O/NH_3$ gas mixture must be diluted with $N_2$ until $N_2$ constitutes at least 85% of the gas mixture. In the absence of the $N_2$ dilution, the hazards associated with this gas mixture increase exponentially. To ensure an appropriate safety margin, a given flow rate of 70% $N_2O/NH_3$ gas mixture must be diluted with $N_2$ until $N_2$ constitutes a minimum of 90% of the gas mixture before the gas mixture enters the compressive stage of the mechanical backing pump.

In summary, the method of the present invention significantly enhances the removal rate of fluorine residue, compared to previously known methods, by creating the aggressive environment for fluorine residue removal reaction. This enhancement is the result of the combined effect of the plasma-produced reactants, a flux of energetic ions on the interior surface of CVD chamber, and the exothermic formation of $H_2O$.

The invention has been described using exemplary embodiments. However, it is to be understood that the scope of the invention is not limited to the disclosed embodiments. On the contrary, it is intended to cover various modifications and similar arrangements. The scope of the claims, therefore, should be accorded to the broadest interpretation so as to encompass all such modifications and similar arrangements.

What is claimed is:

1. A method of operating a deposition process chamber, the method comprising:
    placing a substrate in said process chamber;
    depositing a film on said substrate, said depositing leaving a deposition residue on an interior surface of said chamber; and
    cleaning said deposition residue from said interior surface by creating a fluorine-containing plasma in said chamber, said fluorine-containing plasma leaving a fluorine-containing contaminant on said interior surface; and thereafter removing said fluorine-containing contaminant by
    supplying an oxygen-containing gas into the process chamber,
    supplying a hydrogen-containing gas into the process chamber, said hydrogen-containing gas being different from said oxygen-containing gas and being selected from a group consisting of $NH_3$ and $H_2$;
    producing a plasma comprising a mixture of the oxygen-containing gas and the hydrogen-containing gas, thereby exothermically producing $H_2O$;
    causing the plasma to react with the fluorine-containing contaminant to farm a fluorine-containing material; and
    removing the fluorine-containing material from the process chamber.

2. The method of claim 1, wherein the oxygen-containing gas is selected from a group consisting of $N_2O$, $O_2$ and air.

3. The method of claim 1, wherein producing the plasma produces an ion flux to an interior surface of the process chamber, so that the ion flux results in an ion-enhanced chemical reaction between the plasma and the fluorine-containing contaminant.

4. The method of claim 1, wherein producing the plasma generates a plurality of coordinately and electronically unsaturated radicals and ions that react with the fluorine-containing contaminant.

5. The method of claim 1, wherein the mixture of the oxygen-containing gas and the hydrogen-containing gas is 70 mol % $N_2O/NH_3$.

6. The method of claim 5, wherein a flow rate of $NH_3$ into the process chamber is 1,500 sccm.

7. The method of claim 5, wherein a flow rate of $N_2O$ into the process chamber is 3,500 sccm or less.

8. The method of claim 5, wherein producing the plasma uses a high frequency RF power of 3,000W, and a pressure of the process chamber is 2 Torr.

9. The method of claim 1, wherein the mixture of the oxygen-containing gas and the-hydrogen containing gas is 50 mol % $N_2O/NH_3$.

10. The method of claim 9, wherein a flow rate of $NH_3$ into the process chamber is 1,500 sccm.

11. The method of claim 9, wherein a flow rate of the $N_2O$ into the process chamber is 3,500 sccm or less.

12. The method of claim 9, wherein producing the plasma uses a high frequency RF power of 3,000W, and a pressure of the process chamber is 2 Torr.

13. The method of claim 1, wherein the mixture of the oxygen-containing gas and the-hydrogen containing gas is 52 mol % $O_2/NH_3$.

14. The method of claim 13, wherein a flow rate of $NH_3$ into the process chamber is 2,000 sccm.

15. The method of claim 13, wherein a flow rate of the $N_2O$ into the process chamber is 2,170 sccm or less.

16. The method of claim 13, wherein producing the plasma uses a high frequency RF power of 2,000W, and a pressure of the process chamber is 3 Torr.

17. The method of claim 1, further comprising supplying an inert gas to stabilize the plasma.

18. The method of claim 17, wherein the inert gas is selected from a group consisting of He, Ne, Ar, and Kr.

19. The method of claim 1, wherein the process chamber is a chemical vapor deposition chamber.

20. The method of claim 1 wherein the fluorine-containing material is a fluorine-containing gas.

21. The method of claim 1 wherein the hydrogen-containing gas is $NH_3$ and the fluorine-containing material comprises an ammonium fluoride.

22. A method of operating a deposition process chamber, the method comprising:

placing a substrate in said process chamber;

depositing a film on said substrate, said depositing leaving a deposition residue on an interior surface of said chamber; and cleaning said deposition residue from said interior surface by creating a fluorine-containing plasma in said chamber, said fluorine-containing plasma leaving a fluorine-containing contaminant on said interior surface; and thereafter removing said fluorine-containing contaminant by creating a plasma that generates $H_2O$ and heat in said process chamber, said plasma containing $NH_3$, said plasma reacting with the fluorine-containing contaminant in the presence of said heat to form a fluorine-containing material, said fluorine-containing material comprising ammonium fluoride; and removing the fluorine-containing material from the process chamber.

23. The method of claim 22 wherein the fluorine-containing material is a fluorine-containing gas.

* * * * *

UNITED STATES PATENT AND TRADEMARK OFFICE
CERTIFICATE OF CORRECTION

PATENT NO. : 6,872,323 B1
DATED : March 29, 2005
INVENTOR(S) : Entley et al.

It is certified that error appears in the above-identified patent and that said Letters Patent is hereby corrected as shown below:

Column 2,
Line 48, delete "$C_2P_6$" and replace with -- $C_2F_6$ --.

Column 5,
Line 42, delete "$F_2a$" and replace with -- $F_2$ --.

Column 6,
Line 31, delete "Hat" and replace with -- $H_2O$ --.

Column 8,
Line 13, delete "farm" and replace with -- form --.

Signed and Sealed this

Twenty-eighth Day of March, 2006

JON W. DUDAS
*Director of the United States Patent and Trademark Office*